United States Patent
Dechene et al.

(10) Patent No.: US 12,550,711 B2
(45) Date of Patent: Feb. 10, 2026

(54) INTERCONNECTION FABRIC FOR BURIED POWER DISTRIBUTION

(71) Applicant: INTERNATIONAL BUSINESS MACHINES CORPORATION, Armonk, NY (US)

(72) Inventors: Daniel James Dechene, Watervliet, NY (US); Hsueh-Chung Chen, Cohoes, NY (US); Lawrence A. Clevenger, Saratoga Springs, NY (US); Somnath Ghosh, Clifton Park, NY (US); Carl Radens, LaGrangeville, NY (US)

(73) Assignee: INTERNATIONAL BUSINESS MACHINES COPORATION, Armonk, NY (US)

( * ) Notice: Subject to any disclaimer, the term of this patent is extended or adjusted under 35 U.S.C. 154(b) by 615 days.

(21) Appl. No.: 16/822,803

(22) Filed: Mar. 18, 2020

(65) Prior Publication Data

US 2021/0296234 A1   Sep. 23, 2021

(51) Int. Cl.
| | |
|---|---|
| H01L 23/52 | (2006.01) |
| H01L 21/768 | (2006.01) |
| H01L 23/498 | (2006.01) |
| H01L 23/522 | (2006.01) |
| H01L 23/528 | (2006.01) |

(52) U.S. Cl.
CPC .... *H01L 23/5286* (2013.01); *H01L 21/76816* (2013.01); *H01L 21/76877* (2013.01); *H01L 23/5226* (2013.01); *H01L 23/5283* (2013.01)

(58) Field of Classification Search
CPC ............ H01L 23/5286; H01L 25/0657; H01L 27/0688; H01L 2225/0651; H01L 23/535
See application file for complete search history.

(56) References Cited

U.S. PATENT DOCUMENTS

| | | | |
|---|---|---|---|
| 6,492,244 B1 | 12/2002 | Christensen et al. | |
| 6,498,057 B1 | 12/2002 | Christensen et al. | |
| 8,507,957 B2 | 8/2013 | Hou et al. | |
| 8,723,269 B2 | 5/2014 | Rockett | |
| 9,087,841 B2 | 7/2015 | Christiansen et al. | |
| 9,331,062 B1* | 5/2016 | Lane | H01L 21/76801 |
| 9,570,395 B1 | 2/2017 | Sengupta et al. | |
| 9,716,036 B2 | 7/2017 | Chang et al. | |
| 9,812,396 B1 | 11/2017 | Stephens et al. | |
| 10,636,739 B2* | 4/2020 | Beyne | H01L 27/0922 |
| 10,658,475 B2* | 5/2020 | Then | H01L 29/7786 |
| 2003/0160293 A1* | 8/2003 | Iadanza | H01L 23/481 257/E23.021 |
| 2008/0048331 A1* | 2/2008 | Chen | H01L 23/50 257/773 |
| 2009/0193271 A1* | 7/2009 | Chuang | H01L 23/5286 713/300 |

(Continued)

*Primary Examiner* — Kretelia Graham
*Assistant Examiner* — David J Goodwin
(74) *Attorney, Agent, or Firm* — Tutunjian & Bitetto, P.C.; Robert Richard Aragona (57) ABSTRACT

Power distribution fabrics and methods of forming the same include forming a first layer of parallel conductive lines, having a first width. At least one additional layer of conductive lines is formed over the first layer of conductive lines, with the conductive lines of each successive layer in the at least one additional layer having a different orientation and a different width relative to the conductive lines of the preceding layer.

12 Claims, 7 Drawing Sheets

(56) References Cited

U.S. PATENT DOCUMENTS

| | | | |
|---|---|---|---|
| 2010/0025859 A1* | 2/2010 | Inoue | H01L 24/06 716/136 |
| 2012/0241972 A1* | 9/2012 | Chen | H01L 24/05 257/E23.079 |
| 2018/0197812 A1* | 7/2018 | Or-Bach | H01L 23/3677 |
| 2018/0294267 A1 | 10/2018 | Licausi et al. | |
| 2018/0374791 A1 | 12/2018 | Smith et al. | |

\* cited by examiner

INTERCONNECTION FABRIC FOR BURIED POWER DISTRIBUTION

BACKGROUND

The present invention generally relates to integrated chips and, more particularly, to the fabrication of interconnection fabrics for buried power distribution.

Integrated chips use conductive interconnects to transmit power from a power supply to active circuit components. In some cases, integrated chips route power-carrying interconnects with the same wiring resources as are used to route signals, which consumes resources that might otherwise be used to route signals. For example, in a 7 nm technology, about 15-20% of wiring resources in a layer may be used for power distribution. Additionally, as current needs for devices increases, additional wiring resources are needed to supply sufficient power.

SUMMARY

A method of forming a power distribution fabric includes forming a first layer of parallel conductive lines, having a first width. At least one additional layer of conductive lines is formed over the first layer of conductive lines, with the conductive lines of each successive layer in the at least one additional layer having a different orientation and a different width relative to the conductive lines of the preceding layer.

A power distribution fabric includes stacked layers of conductive lines, with each successive layer having conductive lines that differ in orientation and width relative to the conductive layers lines of a previous layer.

An integrated chip includes a power distribution fabric that has stacked layers of conductive lines, with each successive layer having conductive lines that differ in orientation and width relative to the conductive layers lines of a previous layer. An active layer includes one or more circuit components. A substrate layer is positioned between the power distribution fabric and the active layer, with conductive vias that connect conductive lines in a topmost layer of the power distribution fabric to the one or more circuit components of the active layer.

An integrated chip includes a power distribution fabric that has stacked layers of conductive lines, with each successive layer having conductive lines that differ in orientation and width relative to the conductive layers lines of a previous layer. An active layer includes one or more circuit components. A substrate layer is positioned between the power distribution fabric and the active layer, with conductive vias that connect conductive lines in a topmost layer of the power distribution fabric to the one or more circuit components of the active layer. One or more signal communication layers are positioned on the active layer and provide signal communication to the active layer. The one or more signal communication layers do not include any dedicated power distribution connections. A top package connection layer on the one or more signal communication layers provides off-chip signal communication to the one or more signal communication layers. A bottom package connection layer provides power connections to the power distribution fabric.

An integrated chip includes a power distribution fabric that has stacked layers of conductive lines, with each successive layer having conductive lines that differ in orientation and width relative to the conductive layers lines of a previous layer. An active layer includes one or more circuit components. A substrate layer is positioned between the power distribution fabric and the active layer, with conductive vias that connect conductive lines in a topmost layer of the power distribution fabric to the one or more circuit components of the active layer. One or more signal communication layers are positioned on the active layer. The one or more signal communication layers do not include any dedicated power distribution connections. One or more mixed signal/power layers are positioned on the over the one or more signal communication layers, and include signal communication connections and power distribution connections. One or more interlayer vias connect the power distribution connections in the one or more mixed signal/power layers to the power distribution fabric.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a buried power distribution network. A series of layers of conductive wires, separated by insulator layers and connected to one another by conductive vias, are embedded in, or under, a substrate. This fabric of conductors is used to distribute power to the active layer of a chip and is positioned on a side of the chip that is opposite to the signal-carrying layers. In this manner, power is provided to the active layer, without consuming wiring resources that could otherwise be used for carrying signals between components. Additionally, positioning the power distribution network on the opposite side of the active layer from the signal-carrying layers makes it possible to provide package connections on both sides of the chip.

Additionally, the successive layers of conductive wires in the fabric can have different thicknesses, ranging from thickest on a side that makes connection to a power source, and thinnest on a side that interfaces with the active layer. In this manner, low-resistance, thick wires can be used to distribute power to the various regions of the chip, while thinner wires can interface with specific components, which may be at the fabrication size limit.

Figure 1:
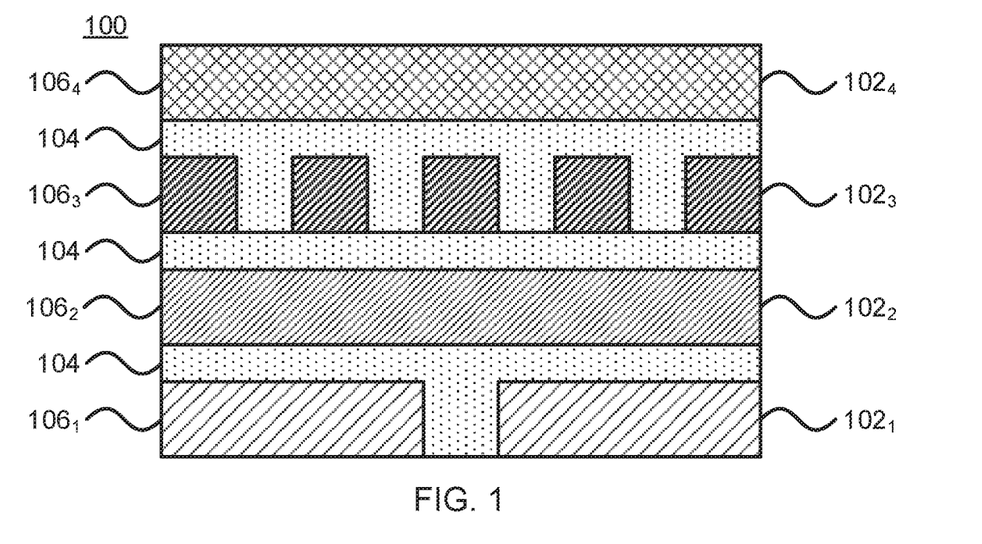
FIG. 1 is a cross-sectional view of a power distribution fabric that includes layers of conductive lines with successively narrower widths to provide efficient power distribution to a layer of circuit components, in accordance with an embodiment of the present invention.

Referring now to the drawings in which like numerals represent the same or similar elements and initially to FIG. 1, a cross-sectional diagram of a conductive fabric 100 is shown. A set of alternating conductive layers 102 and insulating layers 104 is shown. The conductive layers 102 are each formed from multiple conductive wires 106, with each conductive layer 102 having a conductive wires 106 with a width that is different from the conductive wires 106 other conductive layers 102. Thus, for example, the width of conductive wires $106_3$ is smaller than the width of conductive wires $106_1$. The conductive wires 106 in neighboring layers 102 are arranged perpendicularly with respect to one another. Thus, the conductive wires $106_2$ in the conductive layer $102_2$ are formed with a long dimension that runs left-to-right across the page, whereas the conductive wires $106_3$ in the conductive layer $102_3$ have a long dimension that runs into the page.

In some embodiments, the different conductive layers 102 can have the same thicknesses, while in other embodiments, the different conductive layers 102 may differ in thickness. For example, in some embodiments, the lowest conductive layer $102_1$ can be thinner, with increasing thickness in higher layers. In other embodiments, the lowest conductive layer $102_1$ will be thicker, with decreasing thickness in higher layers. The thickness of the conductive layers 102 can be in the exemplary range from about 0.012 µm to about 5 µm, but it should be understood that other thicknesses are also contemplated. The widths of the conductive lines 106 can be in the exemplary range from about 0.012 µm to about 5 µm, but it should be understood that other thicknesses are also contemplated.

The conductive layers 102 can be formed from any appropriate conductive material. Exemplary conductive materials include metals, such as, e.g., tungsten, nickel, titanium, molybdenum, tantalum, copper, platinum, silver, gold, ruthenium, iridium, rhenium, rhodium, cobalt, and alloys thereof. The conductive layers 102 may alternatively be formed from a doped semiconductor material such as, e.g., doped polysilicon.

The conductive wires 106 can be formed by depositing a layer of conductive material and then patterning the conductive material using any appropriate process. While direct photolithography can be used, particularly for those conductive wires 106 having larger widths, smaller wires, particularly those beneath the minimum feature size of a particular photolithographic technology, can be formed using techniques such as sidewall image transfer, whereby sidewalls are formed on a mandrel, the mandrel is removed, and the sidewalls are then used as a mask for the etch. After forming the conductive wires 106, the spaces between the conductive wires 106 can be filled in with an appropriate insulating material.

The insulator layers 104 can be formed by depositing a layer of insulating material over a conductive layer 102, before forming the next conductive layer. In particular, the formation of the insulator layers 104 can be performed at the same time as the spaces between conductive wires 106 are filled, with a single deposition process that overfills the spaces and covers the top surfaces of the conductive wires 106. The insulator layers 104 can be formed from any appropriate dielectric material, such as silicon dioxide. In some embodiments, the insulator layers 104 can be formed from a low-k dielectric material, to reduce capacitances between the conductive layers 102 and between the conductive wires within the layers. This is a larger concern in the layers that are closer to the active layers of the chip, where parasitic capacitances can affect device functions. As used herein, the term "low-k" refers to dielectric materials that have a dielectric constant k that is lower than the dielectric constant of silicon dioxide.

It should be understood that any appropriate deposition process can be used to form the conductive layers 102 and the insulator layers 104, for example chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Although a specific embodiment is shown with four conductive layers 102, each having a same height and material, it should be understood that other embodiments are also contemplated. The number of conductive layers 102 and their properties, including material, width, and height, can be selected as is most appropriate for a given application.

Figure 2:
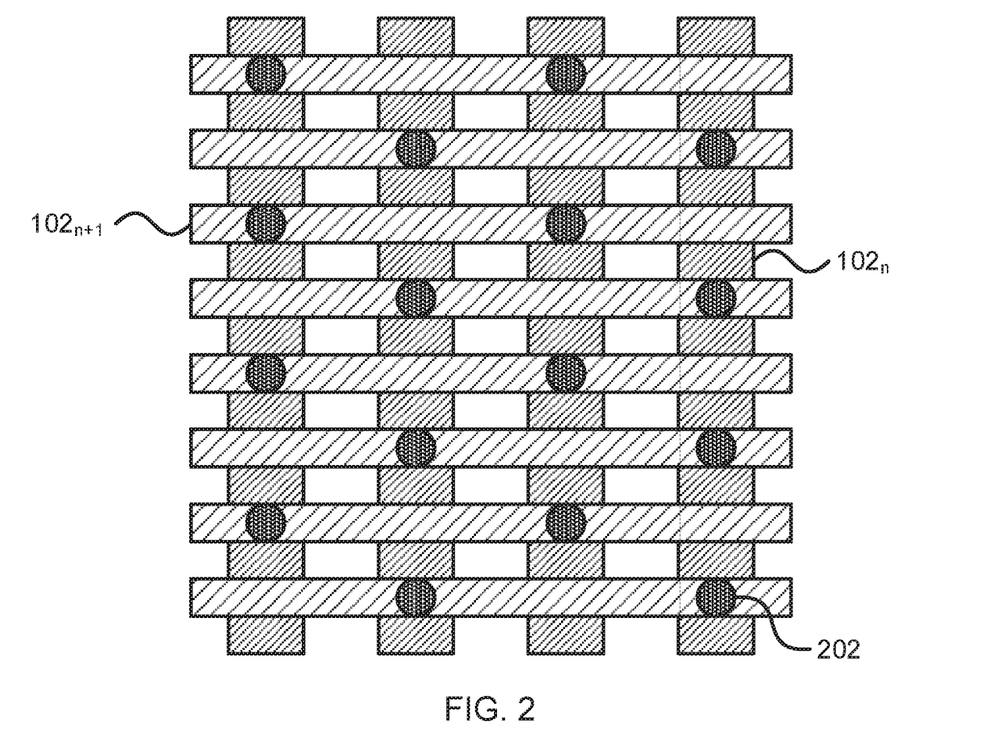
FIG. 2 is a top-down view of two layers of conductive lines and shows interconnections between a relatively wider set of underlying conductive lines and a relatively narrower set of overlying conductive lines, in accordance with an embodiment of the present invention.

Referring now to FIG. 2, a top-down view of two conductive layers 102 in a conductive fabric is shown. The insulating layers 104 are omitted from this view, to expose the underlying conductive layer $102_n$. An overlying conductive layer $102_{n+1}$ is shown, with its conductive wires 106 being laid perpendicularly across the conductive wires 106 of the underlying conductive layer $102_n$. Although perpendicular crossings are specifically contemplated herein, it should be understood that other non-parallel crossing angles can be used instead to provide for power distribution between the layers 102.

Via positions 202 are also shown. It should be understood that the vias themselves are not shown in this view, as they are positioned between the underlying conductive layer $102_n$ and the overlying conductive layer $102_{n+1}$. As can be seen, the via positions 202 are placed in an alternating fashion, such that there are effectively two distinct grids. This makes it possible to provide two distinct voltages, for example with one grid being energized, and the other grid being grounded. The result is that the conductive wires 106 in each conductive layer 102 can have alternating voltages.

It should be understood that, although the conductive wires 106 are shown as being evenly spaced, this need not be the case. In particular, it is contemplated that one or more top layers can be spaced in a manner that is dictated by the connections needed for a particular active layer. Thus, for example, the conductive wires 106 of the top layers $102_3$ and $102_4$ can be positioned to provide power to specific points, while the conductive wires 106 of the bottom layers $102_1$ and $102_2$ can be evenly spaced. Thus, it should be understood that the lower layers of a given fabric 100 can have evenly spaced conductive wires 106, while the upper layers of the fabric 100 can have any appropriate spacing.

This pattern of via positions 202 can be used for each neighboring pair of conductive layers 102 in the conductive fabric, with appropriate via positions 202 being selected for the overlapping points of the respective conductive wires 106. The vias can be formed in these positions by etching openings through the insulator layers 104 in the via positions 202, to expose the conductive wires 106 of the underlying conductive layer $102_n$, before depositing the conductive material for the overlying conductive layer $102_{n+1}$. The conductive material will fill the openings and form the vias.

The openings can be formed by, for example, a photolithographic process that forms a mask with openings over the via positions 202, followed by a selective anisotropic etch, such as a reactive ion etch (RIE). RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. As used herein, the term "selective" in reference to a material removal process denotes that the rate of material removal for a first material is greater than the rate of removal for at least another material of the structure to which the material removal process is being applied. Thus, the etch can remove material from the insulator layer 104 at the via position 202, but will not damage the conductive material of the underlying conductive layer 102*n*.

Figure 3:
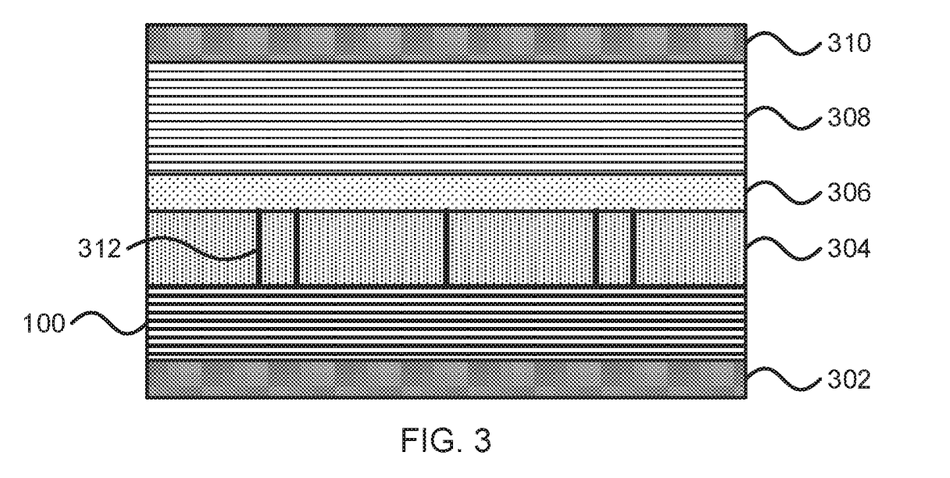
FIG. 3 is a cross-sectional view of an integrated chip package that includes a partially buried power distribution fabric, in accordance with an embodiment of the present invention.

Referring now to FIG. 3, a cross-sectional view of an embodiment of an integrated chip with a fully buried power distribution fabric. The buried power distribution fabric 100 is shown as being underneath a semiconductor substrate 304. A bottom package connection layer 302 is shown on the underside of the power distribution fabric 100, with electrical connections being made to the lowest conductive layer $102_1$ of the power distribution fabric 100. As noted above, the power distribution fabric 100 can have any appropriate number of conductive layers 102, with the thickness of conductive lines 106 within each successively higher conductive layer 102 being smaller than the thickness of the conductive lines 106 of each lower conductive layer 102.

Above the power distribution fabric 100, a semiconductor substrate 304 is formed. This substrate forms the base for the active layer 306 of the integrated chip. It is specifically contemplated that the active layer 306 can also be formed form a semiconductor material, and may include any of a variety of active and passive circuit components, but it should be understood that any appropriate material and contents can be used instead.

The semiconductor substrate 304 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide.

A plurality of conductive vias 312 are formed in the semiconductor substrate 304. These conductive vias 312 make electrical contact with a top conductive layer 102 of the power distribution fabric 100, as well as to devices within the active layer 306. The conductive vias 312 can be formed from any appropriate conductive material.

As noted above, the active layer 306 can include a variety of circuit components. However, interconnectivity between the circuit components may not be possible in a two-dimensional plane. As such, one or more signal layers 308 are formed over the active layer 306, with vertical vias and horizontal interconnects providing signal communication between the various components in the active layer 306. The signal layers 308 can furthermore provide signal communication to a top package connection 310, which can provide signal communications between the integrated chip and off-chip devices.

Figure 4:
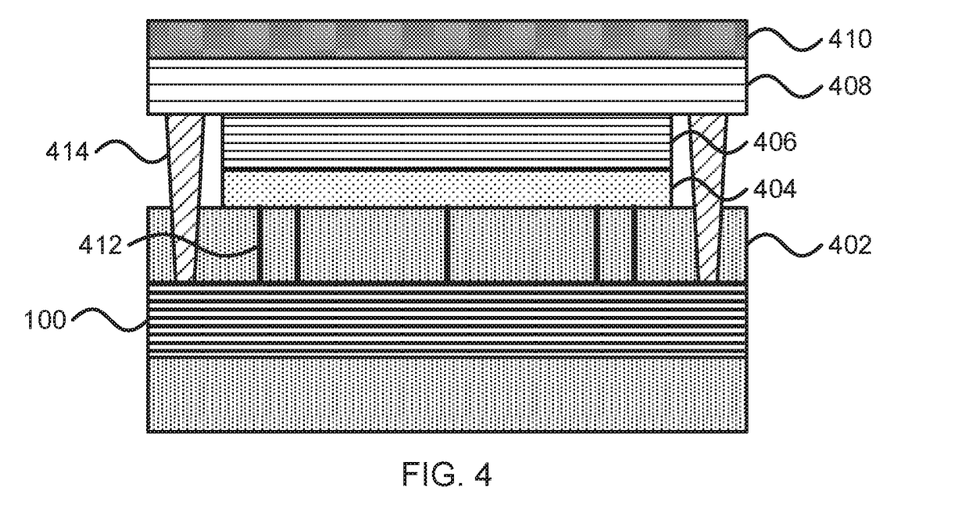
FIG. 4 is a cross-sectional view of an integrated chip package that includes a fully buried power distribution fabric, in accordance with an embodiment of the present invention.

Referring now to FIG. 4, an embodiment of an integrated chip with a partially buried power distribution fabric is shown. In this embodiment, a buried portion of the power distribution fabric 100 is fabricated as described above, but additional power distribution is provided in mixed signal/power layers 408, on the side of the active layer 404.

The buried power distribution fabric 100 is shown as being embedded in the semiconductor substrate 402. To embed the buried power distribution fabric 100, an additional layer of semiconductor material can be wafer bonded on top of the power distribution fabric 100. It should be understood that the bottom package layer 302, shown in FIG. 3, can also be implemented in this embodiment. As above, the semiconductor substrate 402 can include a set of conductive vias 412 that penetrate the substrate 402 and provide an electrical connection between the buried power distribution fabric 100 and the active layer 404.

In this embodiment, in addition to having a set of signal-specific layers 406, there is a set of mixed signal/power layers 408 that are on top of the signal layers 406. An upper package connection layer 410 is then formed over the mixed signal/power layers 408, with appropriate power and signal communication connections.

A set of multi-level vias 414 connect the mixed signal/power layers 408 to the buried power distribution fabric 100. These multi-level vias 414 penetrate through an interlayer dielectric (not shown) to provide electrical connectivity. This embodiment receives its external power connections through the upper package connection layer 410. Power is then distributed to the multi-level vias 414 by way of the mixed signal/power layers 408. The active layer 404 is powered through the buried power distribution fabric 100, by way of the vias 412. In this manner, power can be provided to the active layer 404 without consuming wiring resources in the signal layers 406, and without having a separate power connection layer on the opposite side.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 5:
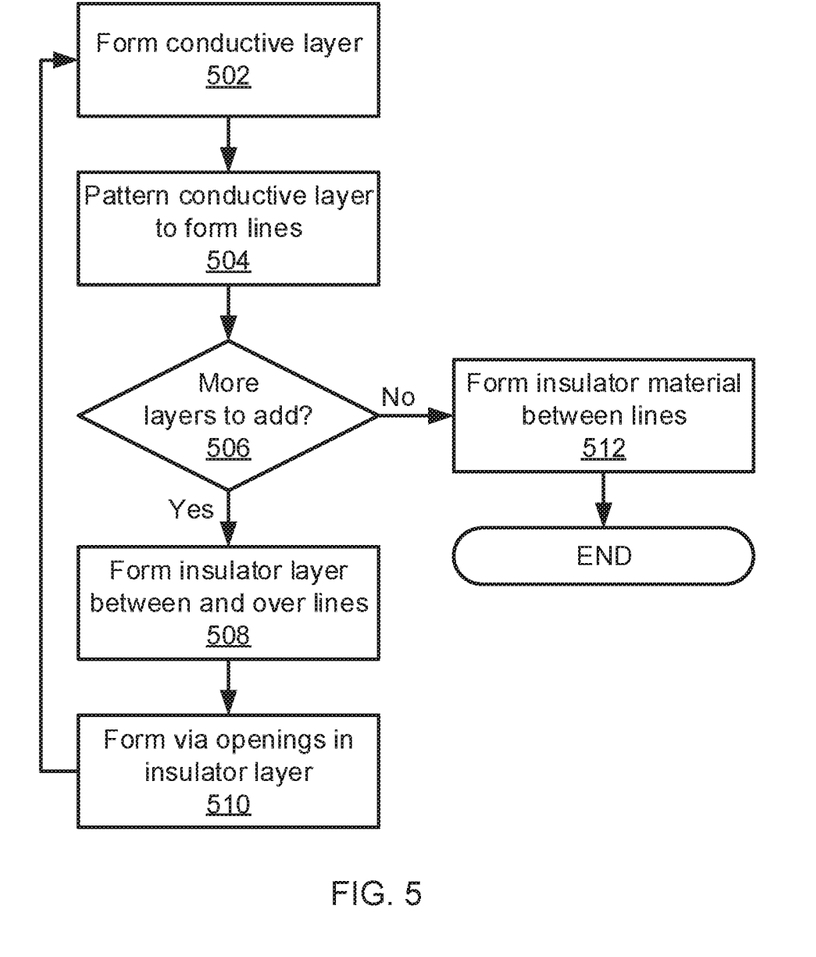
FIG. 5 is a block/flow diagram of a method for forming a power distribution fabric that includes layers of conductive lines with successively narrower widths to provide efficient power distribution to a layer of circuit components, in accordance with an embodiment of the present invention.

Referring now to FIG. 5, a method for forming a power distribution fabric 100 is shown. Block 502 forms a conductive layer 102, for example on a semiconductor substrate, a package layer, or any appropriate transfer wafer. The conductive layer 102 can be formed from any appropriate conductive material, and using any appropriate deposition process, for example CVD, PVD, ALD, or GCIB deposition.

Block 504 then patterns the conductive layer 102 to form conductive lines 106. Depending on which layer 102 is being formed in the stack, block 504 will determine whether to pattern the lines 106 with regular spacing, or to interface with specific via positions in an active layer. Block 504 also determines, based on the position of the layer 102 in the stack, how wide to make the conductive lines 106, with lower layers 102 being formed with conductive lines 106 that are wider than the conductive lines 106 of higher layers 102.

Block 506 determines whether there are more layers 102 to add to the stack. If so, then block 508 forms an insulator layer 104 between and over the conductive lines 106 using any appropriate deposition process and any appropriate dielectric material, such as silicon dioxide. For example, a spin-on CVD process can be used to deposit the dielectric material to a height above the top surface of the conductive lines 106. Block 510 then forms via openings in the insulator layer 104 at via positions 202. This process can involve masking the insulator layer 104 using a photolithographic process, with the via positions 202 remaining exposed, followed by a selective anisotropic etch that exposes the top surfaces of the conductive lines 106 at the via positions. At this stage, block 502 forms another conductive layer 102, and the process is repeated.

If no further conductive layers 102 are to be formed—for example, if the last layer was the top layer of the power distribution fabric—then block 512 forms the insulating material between the topmost conductive lines 106, but does not cover the top surfaces of the conductive lines 106. This can be accomplished by depositing the dielectric material using any appropriate process, followed by polishing the top surface of the dielectric down until the conductive lines 106 are exposed, for example using a chemical mechanical planarization (CMP) process. At this point the power distribution fabric 100 is complete.

CMP is performed using, e.g., a chemical or granular slurry and mechanical force to gradually remove upper layers of the device. The slurry may be formulated to be unable to dissolve, for example, the conductive material, resulting in the CMP process's inability to proceed any farther than that layer.

Figure 6:
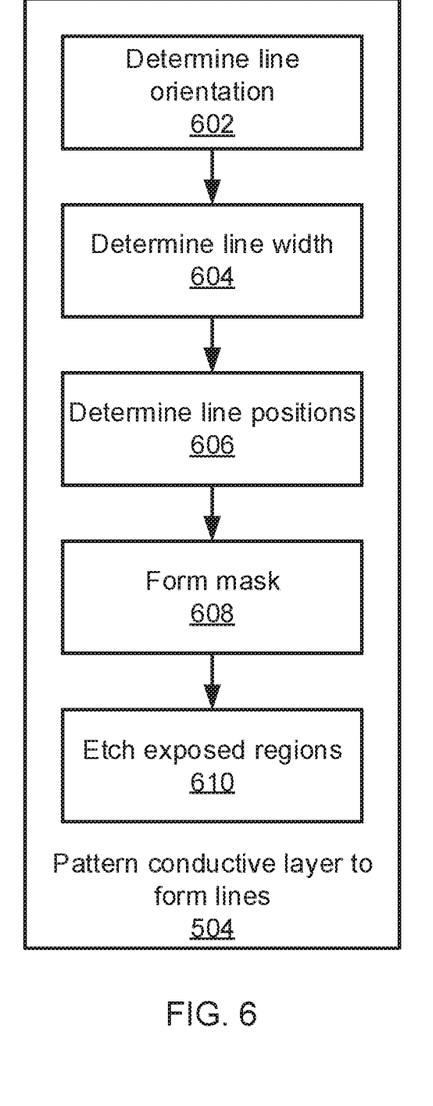
FIG. 6 is a block/flow diagram of a method for patterning a conductive layer to form lines for a power distribution fabric, in accordance with an embodiment of the present invention.

Referring now to FIG. 6, additional detail on the process for patterning the conductive layer to form lines in block 504 is shown. Based on the orientation of the previously formed conductive lines 106 (if any), block 602 determines a line orientation. As noted above, it is specifically contemplated that the line orientation will be perpendicular to the previous line orientation, but it should be understood that other non-parallel orientations can be used instead. Block 604 determines the line width, with successive layers being formed with successively narrower line widths. It should be understood that, although it is specifically contemplated that the first conductive layer 102 may be formed with conductive lines 106 that are the thickest within the power distribution fabric 100, and that each successive conductive layer 102 may have progressively narrower conductive lines, other embodiments may reverse the order of fabrication, with the first conductive layer 102 having the narrowest conductive lines 106, and each successive conductive layer 102 having wider conductive lines 106.

Block 606 determines the positions for the conductive lines, in particular setting the spacing between neighboring lines. Whereas the layers 102 having the wider conductive lines 106 (e.g., the lower layers in the fabric 100) are specifically contemplated as being regularly spaced, the layers 102 having the narrowest conductive lines 106, which provide the most direct interface with an active layer, can be regularly spaced, or can be positioned in accordance with device locations in the active layer.

Block 608 forms a mask over the previous conductive layer 102, in accordance with the determined line orientation, line width, and line positions for the new conductive lines 106. This mask can be formed using any appropriate process, such as a photolithographic process that exposes a photoresist layer to light at an operative wavelength, to cure the exposed regions of the photoresist. A developer is then used, to remove the regions of the photoresist that either were exposed or were not unexposed. The developer thereby exposes regions of the conductive layer 102 that are to be removed.

In some embodiments, the conductive lines 106 for some or all of the conductive layers 102 may have a line width that is narrower than a minimum feature size of the available photolithographic processes. As an alternative to using photolithography to form the mask, sidewall image transfer can be used for some or all of the conductive layers 102. In this process, a mandrel is formed using, e.g., a photolithographic process. A layer of mask material is then conformally deposited on the sidewalls of the mandrel. The mandrel is removed, leaving the sidewall mask material in place. Because the thickness of the deposition can be tightly controlled, very narrow lines can be fabricated in this manner. The process can furthermore be repeated in a single mask, with the sidewall spacers from a first mandrel being used as the mandrels for a subsequent step.

After the mask has been formed in block 608, a selective anisotropic etch, such as an RIE, is used in block 610 to etch away the exposed regions of the conductive layer, thereby forming conductive lines 106.

Figure 7:
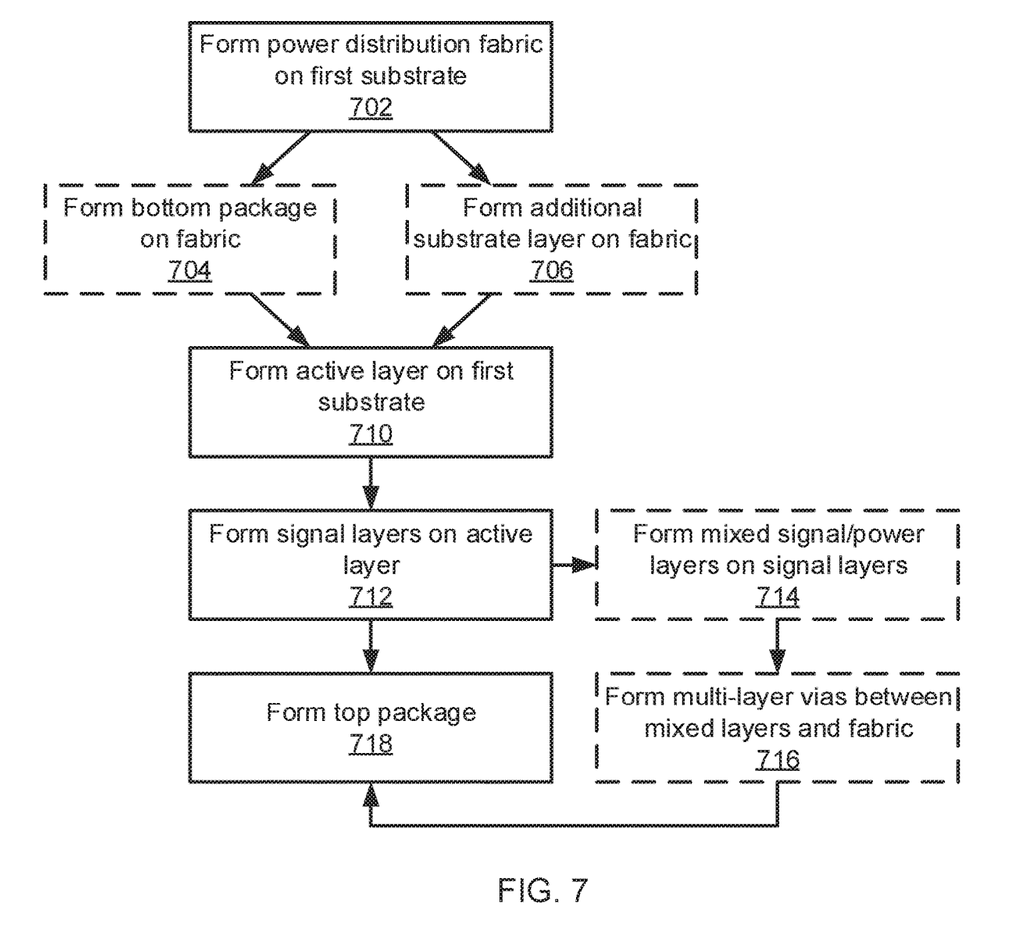
FIG. 7 is a block/flow diagram of methods for forming an integrated chip package with a fully buried or partially buried power distribution fabric, in accordance with embodiments of the present invention.

Referring now to FIG. 7, a method of forming an integrated chip package with a buried power distribution fabric is shown. Block 702 forms the power distribution fabric 100 on a semiconductor substrate 304/402. At this point, either a bottom package layer 302 is formed on the fabric 100 in block 704, or an additional semiconductor layer is formed on the fabric 100 in block 706, for example by wafer bonding.

Block 710 forms the active layer 306/404 on the semiconductor substrate 304/402 by any appropriate fabrication process. As noted above, active layer 306/404 can include one or more active and/or passive circuit components. These components receive power through the conductive vias 312/412. Block 712 then forms signal layers 308/406 over the active layer 306/404. These signal layers can be formed by forming conductive interconnects between the components in the active layer 306/404. Multiple such signal layers can be formed, with appropriate conductive vias being formed through the signal layers 308/406, as needed.

At this stage, if the power distribution fabric 100 is fully buried in the semiconductor substrate 402, then block 714 forms mixed signal/power layers 408 over the signal layers 406. Block 716 forms multilayer vias 414 that connect the mixed signal/power layers 408 to the fabric 100, thereby powering the fabric 100 and the active layer 404, without consuming space in the signal layers 406. In the event that a partially buried power distribution fabric 100 is used, with a bottom package layer 302 providing power to the fabric 100, then the formation of the mixed signal power layers 408 and the multi-layer vias 414 can be omitted. In either case, block 718 forms the top package layer 310/410 to provide signal communication to the device.

Figure 8:
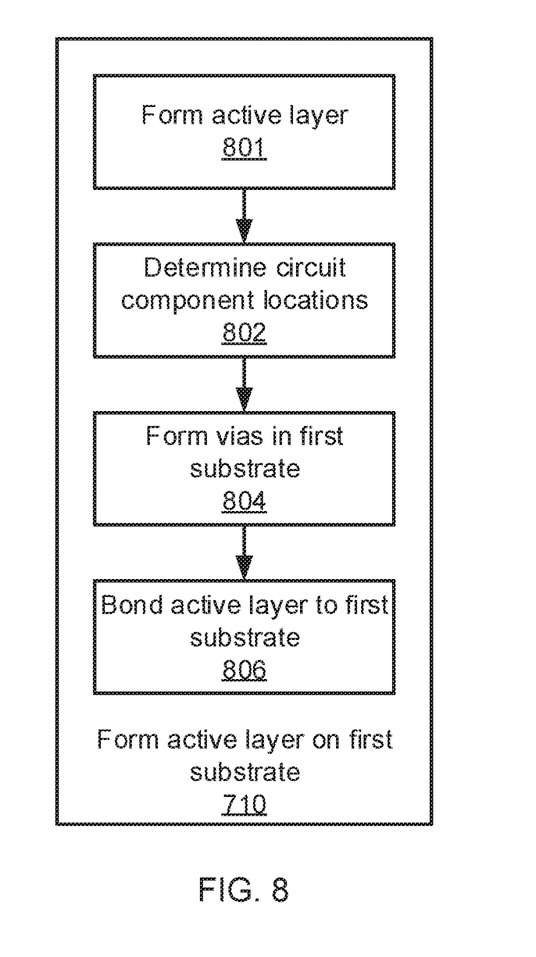
FIG. 8 is a block/flow diagram of a method for forming an active circuit layer on a substrate with power vias, in accordance with an embodiment of the present invention.

Referring now to FIG. 8, additional detail is shown on the step of forming the active layer 306/404 on the substrate 304/402. In these embodiments, it is specifically contemplated that the active layer 306/404 is formed separately in block 801. Block 802 determines circuit component locations in the active layer 306/404, for example based on a design layout of the active layer 306/404. The circuit component locations include electrical contacts on a bottom surface of the active layer 306/404, where power connections are needed.

Block 804 forms vias 312/412 in the substrate layer 304/402, in positions that correspond to the determined circuit component locations. These vias 312/412 connect to conductive lines 106 in the underlying power distribution fabric 100. Block 806 then bonds the active layer 306/404 to the substrate 304/402, for example using any appropriate wafer bonding process, such that the vias 312/412 align with the determined circuit component locations and form suitable electrical connections.

Having described preferred embodiments of an interconnection fabric for buried power distribution (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a power distribution fabric, comprising:
    forming a first layer of parallel conductive lines, having a first width and a consistent line spacing;
    forming at least one additional layer of conductive lines over the first layer of conductive lines to form a power distribution fabric, with the conductive lines of each successive layer in the at least one additional layer having a different orientation and a different width relative to the conductive lines of the preceding layer, wherein all but one of the at least one additional layer of conductive lines is formed with consistent line spacing and wherein a final additional layer of the at least one additional layer of conductive lines is formed with an inconsistent line spacing;
    forming an active layer that includes one or more circuit components electrically connected to the power distribution fabric; and
    forming a signal communication layer that provides signal communication to the active layer without dedicated power distribution connections.

2. The method of claim 1, wherein forming at least one additional layer of conductive lines comprises forming layers of conductive lines that have successively narrower widths relative to previous layers.

3. The method of claim 1, further comprising forming insulating layers that separate vertically adjacent pairs of layers of conductive lines.

4. The method of claim 3, further comprising forming vias that penetrate respective insulating layers to connect pairs of conductive lines in respective pairs of vertically adjacent layers of conductive lines.

5. The method of claim 4, wherein the vias connect alternating lines between a respective pair of layers of conductive lines to establish two distinct electrical networks of lines.

6. The method of claim 1, further comprising forming a semiconductor layer between the power distribution fabric and the active layer, with conductive vias that connect conductive lines in a topmost layer of the power distribution fabric to the one or more active components of the active layer, to form an integrated chip package.

7. The method of claim 6, further comprising:
    forming a top package connection layer that provides signal communication to the active layer; and
    forming a bottom package connection layer that provides power connections to the power distribution fabric.

8. The method of claim 7, wherein the signal communication layer is positioned between the top package connection layer and the active layer.

9. The method of claim 6, wherein the signal communication layer is formed on the active layer, further comprising forming one or more mixed signal/power layers on the signal communication layer that include signal communication connections and power distribution connections.

10. The method of claim 9, further comprising forming one or more interlayer vias that connect the power distribution connections in the one or more mixed signal/power layers to the power distribution fabric.

11. The method of claim 1, further comprising electrically connecting a power supply to the power distribution fabric.

12. A method for forming a power distribution fabric, comprising:
    forming a first layer of parallel conductive lines, having a first width;
    forming at least one additional layer of conductive lines over the first layer of conductive lines to form a power distribution fabric, with the conductive lines of each successive layer in the at least one additional layer having a different orientation and a different width relative to the conductive lines of the preceding layer;
    forming an active layer that includes one or more circuit components electrically connected to the power distribution fabric;
    forming a semiconductor layer between the power distribution fabric and the active layer, with conductive vias that connect conductive lines in a topmost layer of the power distribution fabric to the one or more active components of the active layer, to form an integrated chip package;
    forming a signal communication layer on the active layer that provides signal communication to the active layer without dedicated power distribution connections;
    forming a mixed signal/power layer on the signal communication layer that includes signal communication connections and power distribution connections, wherein the signal communication layer is positioned between the active layer and the mixed signal/power layer;
    forming one or more interlayer vias that connect the power distribution connections in the one or more mixed signal/power layers to the power distribution fabric, bypassing the active layer; and
    electrically connecting a power supply to the power distribution fabric.

* * * * *